United States Patent [19]

Savant et al.

[11] Patent Number: 5,384,221
[45] Date of Patent: Jan. 24, 1995

[54] BIREFRINGENT AZO DYE POLYMER ERASABLE OPTICAL STORAGE MEDIUM

[75] Inventors: Gajendra D. Savant, Pasadena; Tomasz P. Jannson, Torrance, both of Calif.

[73] Assignee: Physical Optics Corporation, Torrance, Calif.

[21] Appl. No.: 51,252

[22] Filed: Apr. 21, 1993

Related U.S. Application Data

[63] Continuation of Ser. No. 626,189, Dec. 12, 1990, abandoned.

[51] Int. Cl.$^6$ .......................... G03C 1/00; G11C 13/02
[52] U.S. Cl. ........................... 430/19; 430/945; 430/1; 430/270; 365/120; 365/121
[58] Field of Search ............ 430/19, 270.1, 495, 430/945.2; 346/135.1; 359/1.3; 369/99, 100; 365/120, 121

[56] References Cited

U.S. PATENT DOCUMENTS

| | | | |
|---|---|---|---|
| 4,380,769 | 4/1983 | Thomas et al. | 430/945 |
| 4,551,819 | 11/1985 | Michl et al. | 365/120 |
| 4,562,107 | 12/1985 | Daniels | 428/196 |
| 4,635,076 | 1/1987 | Willson | 430/495 |
| 4,649,169 | 3/1987 | Thompson et al. | 525/155 |
| 4,666,819 | 5/1987 | Elmasry | 430/495 |
| 4,686,143 | 8/1987 | Yoshikawa et al. | 346/135.1 |
| 4,686,169 | 8/1987 | Yoshino et al. | 430/945 |
| 4,864,537 | 9/1989 | Michl et al. | 365/121 |
| 4,954,543 | 9/1990 | Lewis et al. | 430/495 |
| 4,960,679 | 10/1990 | Nakagiri et al. | 430/495 |
| 5,011,756 | 4/1991 | Nikles | 430/495 |
| 5,139,928 | 8/1992 | Lewis | 430/495 |
| 5,147,930 | 9/1992 | La Fleur et al. | 525/56 |
| 5,296,321 | 3/1994 | Kawanishi et al. | 430/19 |

FOREIGN PATENT DOCUMENTS 2260127 10/1990 Japan ............................ 430/19

OTHER PUBLICATIONS

Gong et al. "Holographic Method for investigation of Photochemical Processes of MR in PMMA & PS" J. Phys. Chem. 91 4504 1987.
Chemical Abstracts 1982 Index Guide p. 277G (1982).
Todorov et al. "Photoinduced Anisotropy in . . . " iEEE J. Quant Electron. (22) #8 1262-67 (1986).
Nuyken et al. "Azo polymers . . . " Makromol. Chem. (190) 469–75 (1989).

Primary Examiner—Charles L. Bowers, Jr.
Assistant Examiner—Martin J. Angebranndt
Attorney, Agent, or Firm—Nilles & Nilles

[57] ABSTRACT

An optical storage medium including a transparent polymer and an isomerizable AZO dye, the optical storage medium being coated as a water miscible solution on a substrate so as to form a film having a thickness of from $\mu m$ to 100 $\mu m$ storing information through birefringence and having a diffraction efficiency greater than 40% at a 1 millisecond response time. The isomerizable AZO dye remains in the film and is present in a concentration of from 4.5% to 25% based on the weight of the film.

19 Claims, 1 Drawing Sheet

BIREFRINGENT AZO DYE POLYMER ERASABLE OPTICAL STORAGE MEDIUM

This application is a continuation, of application Ser. No. 07/626,189, filed Dec. 12, 1990, now abandoned.

BACKGROUND OF THE INVENTION

1. Field of the Invention

This invention relates to polymeric memory media for high density optical data storage. Specifically, this invention relates to a birefringent composite AZO dye polymer and its application to erasable, direct overwrite digital storage (optical disk), analog storage (video disk), cache and waveguide memory, and optical storage of information through birefringence.

2. Description of the Prior Art

A. Media

The advancing technology of optical information storage devices capable of instantaneous optical recording, high capacity data storage, and random-access retrieval requires material (media) that generate high signal to noise ratio (SNR), low defect density level, high sensitivity and stability, and direct read after write (DRAW) capability. Optical recording technology has been divided into: 1) read-only, 2) write-once, and 3) erasable (reversible) media discussed in turn below.

i. Read Only Media

With respect to read-only media, a thin photopolymerizable liquid is cured 'in situ' between substrate and the master, and stripped off to effect pattern transfer. The photopolymerizable materials used include multifunctional acrylates with epoxy or vinyl silicone as discussed in J. Van den Broek et al., J. Rad. Curing 11, 2 (1984); and J. Kloesterboer et al., J. Rad. Curing 11, 10 (1984) incorporated herein by reference as are all publications cited below.

ii. Write-Once Media

With respect to write-once media methods, these methods include (i) ablative recording (pit forming dye-polymer film, dye pigment films), (ii) bubble-deformation recording, and (iii) nondeformation recording each of which is discussed below. Ablative recording involves optical energy absorption, in the film of non-AZO dyes as discussed in A. Bell et al., IEEE J. Quantum Electron. 4, 487 (1978); V. Jipson et al., J. Vac. Sci. Technol. 18, 105 (1981), in non-AZO dye-polymer solutions as discussed in D. Howe et al., J. Vac. Sci. Technol. 18, 92 (1981); K. Law et al., Appl. Phy. Lett. 36, 884, (1980), and in polymer composites that produce a pit in the film by a combination of ablation and material flow.

How and Wrobel in J. Vac. Sci. Technol. 18, 92 (1981) investigated a yellow 3,3'-carbonyl bis (7-diethylamino coumarin)

in cellulose nitrate polymer binder where the wavelength of the recording light was 488 nm and the reading wavelength 633 nm, at which the medium was transparent. At lower exposure, most areas yielded poorly defined marks whereas in high exposure areas holes were formed. Organic polyester yellow dye in polyvinyl acetate has been used by Law et al., Appl. Phy. Lett. 36, 884 (1980) in ablative optical recording. Polyester yellow dye shown below in polyvinyl acetate can be spin coated onto a reflective substrate. The recording can be done at 457 nm and reading at longer wavelengths.

There are obvious disadvantages of this technique. Reciprocity failure occurs at low power and high energy recording as a result of heat flow and mass motion. Localized Spot temperature can exceed 1000° C. which can cause significant decomposition and vaporization of the organic material.

Investigation into the pit formation in dye (pigment) film has been carried out by V. Novotny et al., J. Appl. Poly. Sci. 24, 1321 (1979), J. Appl. Phys. 50, 1215 (1979); and L. Alexandru et al., Polym. Prepar. 25, 305 (1984) using a dye designated as NK 1748, i.e., 3,3'-diethyl-1,2-acetyl-thiotetracyanine shown below produced by Japanese Research Institute for Photosensitizing Dyes Co., Ltd. at 835 nm recording wavelength, and at 950 nm and higher reading wavelengths.

Other prominent dyes useful for this mode of recording include hydroxy squarylium, and Disperse Red 11 (produced by ICI), Disperse Blue 60 (produced by DuPont), Disperse Yellow 88 (produced by Kodak), fluorescein, 1,5-diamino anthraquinone, and Rhodamine-B.

The second type of write-once media involves bubble deformation. Bubble deformation optical recording media consist of polymers such as PMMA, poly,4-methylstyrene, polycarbonate, polysulfone, and poly(fluorocarbon) as a spacer between thin absorbing layers such as Ti, Au, Pt and reflective substrates such as Si:B:C alloy.

Nondeformation recording media, the third type of write once media, consist of mainly nonpolymeric inorganic materials such as complex chalcogenide glasses not further discussed here.

iii. Erasable Media

With respect to erasable or reversible optical recording technology, the technology of the present invention, in 1983 a prototype reversible system was first demonstrated based on Te:Te $O_2$ medium doped with Ge, In or Pb, a 830 nm diode laser utilized as the writing and reading beam, and a 780 nm diode laser used as the erasing beam. N. Akihara et al., SPIE Optical Disk Technology 329, 195 (1982); Ohta et al., U.S. Pat. No. 3,971,874 (1976) discuss this technology. Being easy to fabricate, process, and use in erasable memory applications, organic/polymer materials have been widely investigated for the last several years. These reversible media materials have been known as photochromics, phase-change ablative-dye polymers, and dye composites. Some of these are discussed in detail below.

Photochromic material based optical recordings as a means of holographic data storage have been studied by Plessey Research as shown in Plessey Research Ltd., Annual Report, 66, (1977); and Plessey Research Ltd., Photochromic Data Sheets. The Plessey medium is similar to high resolution photographic emulsion and is of the fulgimide family, molecularly dispersed in polymer binder. This fulgimide photochromic system functions as shown below where UV light is used to generate active photochromics, thereby creating an image. An Ar laser is used to erase the image.

Thioindigo dyes (non-AZO) have been extensively investigated as the working substance of photochromic materials in optical data storage devices as discussed in G. Haucke et al., J. Prakt. Chem. 321 (6), 978–986 (1979); C. Kages et al., Ber. Bunsenges. Phys. Chem. 86, 716 (1982); and D. Russ, Appl. Opt. 10, 571 (1971). The difficulty with indigo dyes is that they are unstable when exposed to heat and visible light, and insensitive in the IR region.

The theory and mechanism of photochromism relating to optical storage have been studied extensively and are discussed in detail in the following references: G. Brown, (Ed.) "Photochromism" Techniques of Chemistry, Vol. 3, Wiley-Interscience, New York, (1971); R. Hurditch, et al., "Photochromic Material for Optical Data Recording Application", Allen Clark Research Center, Annual Review, page 66 (1977) (holographic information storage); D. Kermisch, "Efficiency of Photochromic Gratings", J. Opt. Soc. Am. 61, 1202–6 (1971) (theory of recording process); W. Tomlinson, "Volume Holography in Photochromic Materials", Appl. Opt. 14, 2453 (1975); W. Tomlinson, "Dynamics of Photochromic Conversion in Optically Thick Samples Theory", Appl. Opt. 15, 821 (1976); and G. Scrivener, "Thick Phase Holograms in Color Center Materials", opt. Comm. 10, 32–6 (1974) (efficiency at wavelengths other than peak absorption). Current photochromic materials record information by absorbing energy.

Advanced research in thioindigo dyes has been directed to the covalent attachment of non-AZO chromophobic dye molecules to a polymer chain as shown by Law in German Patent No. DE 3,007,296 AL (1981). The chemical structure was that obtained by reacting Poly(chloromethyl Styrene) with 7-carboxythioindigo dye; and the second by reacting Poly(diethyleneglycolmethacrylade) with Napthothioindigo dye.

Other examples of erasable memory media include: (i) the work of J. Marotz in J. Appl. Phys. B 3, 181–87 (1985) related to holographic memory storage in Poly(methyl methacrylate) blocks sensitized with titaniumbis cyclopentadienyl-dichloride, (ii) photodichroic memory storage as discussed in N. Borelli et al., Proc. Soc. Photo-Opt. Instrument Engineering, 222, 48 (1980); L. Agrevand et al., Opt. Spectrose. USSR, 48, 442 (1980) and 50, 507 (1981); V. Zhanov et al., Opt. Comm. 30, 329 (1974); and E. Krasnikov et al., Acad. Sci. USSR Phys. Chem. 245, 314 (1979), (iii) photographic media, (iv) photo resist media, (v) photopolymeric media, and (vi) electro-optic media as discussed in R. Bartolini et al., Optical Engineering 15 (2), 99–108 (1976). Apparently, none of these operate on the principle of birefringence.

With respect specifically to holographic and optical storage a number of various recording materials have been used including several mentioned above.

Relatively recent optical storage technologies include (i) electron trapping storage as discussed in T. Lindmayer et al., Laser Focus World, Nov., 119 (1989); (ii) two photon, three dimensional memory storage as discussed in D. Parthenopoylos, Science, 245, 843 (1989); and (iii) magneto-optic storage as discussed in J. Isailovic, "Videodisk and Optical memory Systems", 303, (Prentice Hall) (1985).

iv. Erasable AZO Dye Polymer Media

AZO dye polymer materials have not been reported as used for holography and particularly for polarization holography except by Todorov et al. and Couture et al. The use of methyl orange with poly vinyl alcohol as a polarization holographic material was first reported in 1984–85 by Todorov et al., Applied Optics, 23, 4309 (1984); 23, 4588 (1985); and 24, 785 (1985); and L. Nikolova et al., Optical Acta, 31, 5, 579 (1984). Todorov et al., however, achieved a diffraction efficiency of only 20% at a response time of 40 sec and an index modulation (An) of 0.0009 using their dye polymer system.

Recently, Couture and Lessard, in Applied Optics, 27, 3368 (1988) measured modulation transfer function in thin layers of methyl orange/poly vinyl alcohol and methyl red/poly vinyl. While Todorov, et al. discussed the holographic and birefringent use of AZO dye polymer, Nuyken et al., Makromol Chem. 190, 469 (1989) have only studied the cis/trans isomerization as well as decomposition mechanism and crosslinkings in AZO dye polymer.

Attachment of AZO moiety containing dye to polymer backbone chain has been reported by Ichimura et al., Makromol Chem. Rapid Comm. 10, 5 (1989) as a means to create alignment change in liquid crystal. Furthermore, degenerate four wave mixing experiments have been performed in an AZO dye polymer system by Mailhot et al., SPIE 1183, 268 (1989) involving benzopurpurine 4:B and chrysoidine. Recently a red light sensitive-dye polymer system consisting of Oil Red 0 or Sudan III or Sudan IV in PMMA has been investigated for optical recording by Tomova et al., SPIE 1183, 268 (1989).

B. Direct Overwrite Recording

A desirable feature for all data storage media is the ability to record new information on previously recorded areas without erasing the old information in advance. Such capability was inherent to the magnetic disk and tape technology and has therefore been taken for granted by system developers and other users. The new optical disk technology unfortunately does not have "direct overwrite" capability. Of course, it is not possible to erase information from CD, CD-ROM and WORM media. Magneto-optic media does not permit direct overwrite either. A given track of a magneto-optical disk whose information is no longer needed must be erased during one revolution of the disk before any new information can be recorded on it during a later revolution.

Currently, there are a number of ways around the problem. The first is to change the operating system, so that control of the erasing process is within the disk drive itself. In this way the drive will erase the deleted files during its idle time. This solution is currently unpopular because it requires modification of the existing operating systems. There are no guarantees that in a given environment the drive will have sufficient idle time for all the necessary erasures.

The second solution to the lack of overwritability is to use two lasers and two magnets in each optical head, so that when one pair (laser & magnet) is erasing the old data, another (trailing) pair is recording new information. Considerations of cost and complexity have ruled out this solution as well.

The third state of the art solution involves the design of a bilayer or trilayer magnetic medium with interlayer exchange coupling. Such media must work with two permanent magnets, one of which is responsible for recording on the storage layer and the other in charge of erasing the assisting layer. (In trilayer exchange coupled media, the first layer is the storage layer and the third layer is the assisting layer. The second layer is a layer with in-plane magnetization whose task is only to smooth out the transition of magnetization between the first and third layers). The laser operates in two levels for recording the two kinds of magnetic domains. When the laser power is high a reverse domain is written in both storage and assist layers. When the laser power is low either nothing is written or, if a domain has previously been written, it will be erased. A complete description of this direct overwrite system is provided in K. Aratani et al., SPIE, Vol. 1078 "Data Storage Meeting," Los Angeles, California, 258 (1989). The complex structure of the media in this scheme reduces the design flexibility available for simpler media and makes performance compromises unavoidable. The bilayer and trilayer media therefore suffer from a reduced carrier-to-noise ratio (CNR) in comparison with the simpler media that contain only one magnetic layer.

The other erasable optical medium, known as phase-change media, permits direct overwrite. Phase-change media, however, has been beset by a variety of problems (phase-segregation being the most severe).

C. Modulation of Recorded Information

With respect to modulation schemes, all traditional data storage media are essentially binary in amplitude (either domain with "up" magnetization or domain with "down" magnetization). This means that the only possibility for modulation encoding is pulse width modulation (since the amplitude is either $+1$ or $-1$, one should change the width of the pulse in order to encode information). For a comprehensive description of modulation codes see A. Patel, "Signal & Error-Control Coding", Chapter 5 in "Magnetic Recording", 2, C. Denin Mee, et al. (Ed.), McGraw Hill, (1988).

It is currently possible to store information on a magnetic or optical disk in a way that every transition (up to down or mark to no-mark) corresponds to more than one bit of information. The following example is helpful to understanding this concept (known as modulation coding) in the context of mark-no-mark storage. If the minimum size of the optical spot (focused by a high NA lens on the disk) is 1 $\mu$m, then the easiest way to record data is to create marks which are either 1 $\mu$m, 2 $\mu$m, 3 $\mu$m, etc. in size. Although the minimum mark size must be 1 $\mu$m, there is no physical limit on the size of marks that are greater than the minimum length.

Currently, NRZI coding of user data imposes the constraint that all marks should be integer multiples of the minimum mark length. Now, if the user data is first encoded into another stream of zeros and ones, and if there are certain constraints on this stream (for instance, minimum number of zeros between successive ones is two and a maximum number of zeros between successive ones is seven, as in the 2,7 code) then it is possible to create marks whose length are no longer integer multiples of 1 $\mu$m. In this way the 2,7 code has been able to increase the capacity of the storage media by about 50%. Other modulation codes can provide even more flexibility provided that the medium has enough freedom from jitter because the drawback of modulation code is always the reduced window in time that is available to the system for searching and locating the position of the mark boundary (i.e., transition).

The above discussed methods and materials have shown only limited optical efficiencies. Likewise, current optical disk technology and recording techniques have important limitations because of deficiencies in the storage medium. A material which is birefringent and a method of processing which overcomes the problems of low efficiency, short storage life, difficulty in fabrication, and that is useful in a broad range of optical storage applications and allows for direct overwrite recording would be of great benefit.

SUMMARY OF THE INVENTION

A birefringent AZO dye polymer is presented for applications such as optical disk (digital storage), video disk (analog storage), cache memory (page storage) and wave guide memory. Specifically, an optical recording (storage) medium comprising a blend of isomerizable dye and a polymer or an isomerizable dye covalently attached to a polymer backbone is disclosed. One aspect of the invention is isomerizable AZO dyes which dissolve in simple solvents like water, and the selection and synthesis of a polymer attached to the dye by blending or covalent attachment. Another aspect of the invention is to provide a material capable of orienting the axis of induced anisotropy in several possible directions which greatly increases storage density and which allows for erasure and direct overwrite of information. Additional aspects of the invention include a material in which multiple recordings may be made on the same spot by changing the angle of the recording beam, and storage of many more bits on a given spot. For example, if the recorded spot has one of 32 possible axis of anisotropy, this would correspond to 5 bits of information per spot ($2^5 = 32$ different patterns). Another aspect of the invention is a material having a switching speed on the order of tens of micro seconds and recyclability, i.e., a recording material that has no apparent fatigue. Yet another aspect of the invention is a recording material that is "all optical" in nature, e.g., an optical disk based on this material does not require external biasing or electromagnets as is typical in magneto-optic systems.

Yet another aspect of the invention is to provide a low cost method of processing a material yielding a diffraction efficiency as high as 85–90%.

A still further object of the invention is that multilevel storage using a combination of polarization modulation and mark length modulation, is possible as well as volume data storage using several storage layers on a single substrate.

The above objects are attained by an optical storage medium comprising a birefringent AZO dye polymer which stores information through birefringence. The polymer and the dye may be blended or covalently bonded and the polymer may be a vinyl polymer modified with glyoxal, formaldehyde, or acrylic acid. The various polymers of the storage medium may correspond to the following formulas where n, m, and t are preferably in the ranges of 1200–1400, 200–300, and 7–40 respectively, having molecular weights of about 75,000–90,000 and may preferably be those polymers specifically disclosed herein. The AZO dye used in the storage medium may preferably be an isomerizable AZO dye including, for example, those specifically disclosed herein.

The above objects of the invention may also be attained by a method of making an optical storage medium comprising a transparent polymer and an isomerizable AZO dye, said method comprising the steps of making a clear solution of the polymer, filtering the polymer solution, making a dye solution in appropriate parts of solvent, filtering the solvent solution, mixing the polymer and dye solutions, coating the mixed solution on a substrate, spinning the coated substrate to achieve the desired thickness, and heating the coated substrate to between 50°–90°.

The above objects are also attained by a method of recording the medium comprising the steps of exposing the medium to laser light which is variably polarizable, and focused to a spot on the medium. Such method may achieve an optical storage medium having a diffraction efficiency from 40–90%. Applications of the storage medium include erasable, direct overwrite digital storage (optical disk), analogue storage, video disk, cache and waveguide memory, and optical storage of information through birefringence.

DESCRIPTION OF THE PREFERRED EMBODIMENTS

In accordance with the present invention an optical recording material comprises an isomerizable AZO dye blended with or covalently bonded to a polymer backbone. The polymer backbone may preferably comprise an alkyl chain with hydroxy and methoxy groups attached randomly to it. The alkyl chain may preferably broadly include an ethylene poly vinyl system or poly vinyl polymer. The functional groups which may preferably be attached to spaced locations on the backbone are —OH (hydroxy), $OCH_3$ (methoxy), and hydrogen. Polymers, and composites thereof, which may be used in the invention may preferably be of the following chemical formulas:

where n, m, and t approximately range from 1200–1400, 200–300, and 7–40 respectively having molecular weights of about 75,000–90,000. In fact, the structure of the polymers is random, i.e., the number and position of the m, n, and t groups is random and not well defined from chain to chain, and thus the values of n, m, and t vary widely and are not easily determinable. Specific polymers which may be used are given in Table 1 below for purposes of illustration not limitation:

| NO. | POLYMER | MOL. WT. |
|---|---|---|
| 1 | Poly (vinyl Acetate) | 124,000 to 250,000 |
| 2 | Poly (vinyl Alcohol) | 4,000 to 250,000 with different degrees of hydrolysis. Degree of hydrolysis ranged from 50% to 100% with a preferred hydrolysis of 70–88% and weight of 75,000 to 90,000. |
| 3 | Poly (styrene) | 45,000 to 600,000 |
| 4 | Poly (methyl methacrylate) | Low, medium to high molecular weight |
| 5 | Epoxy Resin | NA |
| 6 | Poly (vinyl chloride) | Low, medium & high molecular weight |
| 7 | Poly carbonate | Low, medium & high |

| NO. | POLYMER | MOL. WT. |
|---|---|---|
| 8 | Poly (styrene-co-acrylonitrile) | Low, medium & high molecular weight |
| 9 | Poly (allyl diglycol carbonate) | Low, medium & high molecular weight |
| 10 | Poly (methyl pentane) | Low, medium & high molecular weight |
| 11 | Poly (acrylonitrile-butadiene styrene) ter polymer | Low, medium & high molecular weight |
| 12 | Poly (styrene-co-methyl-methacrylate) | Low, medium & high molecular weight |
| 13 | Poly (ethylene vinyl alcohol) | Low, medium & high molecular weight |
| 14 | Poly (vinyl acetal) | Low, medium & high molecular weight |
| 15 | Poly (propylene) | Low, medium & high molecular weight |
| 16 | Poly (ethylene-co-acrylic acid) | Low, medium & high molecular weight |
| 17 | Poly (ethylene-co-ethyl acrylate) | Low, medium (preferred) & high molecular weight |
| 18 | Phenol-formaldehyde resin | NA |

The preferred polymer used in the medium of the present invention is number 2 above made by DuPont under the tradename Elvanol. Other transparent poly vinyl polymers not listed above may work as well. For purposes of illustration not limitation, polymer modifying agents or crosslinking agents which may be used, are paraformaldehyde, glyoxal, butyraldehyde and acrylic acid. Other multifunctional compatible monomers may be used as modifying agents as well.

Suitable AZO group containing dyes include those listed in Table 2 for purposes of illustration and not limitation.

Ponceau 5

Mordant Blue 9

Methyl Red

Methyl Orange

Methylene Blue

Disperse Orange 25

Disperse Red 1

-continued

Palatine Chrome Black 6BN →

Palatine Chrome Black WAN →

Palatine Fast Yellow BLN →

Acid Blue 161 →

Acid Red 183 →

Ethyl Orange →

Crocein Orange →

Diphenylthiocarbazone →

Mordant Orange 10 →

Mordant Yellow 7 →

Chrysoidin →

Mordent Orange 1 →

Mordant Yellow 10 →

Mordant Yellow 12 →

Toluidine Red →

Sudan Orange G
[Solvent Orange 1, 4
-(phenylazo)-resorcinal] →

-continued

4(2-Pyridylaz0)Resorcinal Monosodium Salt Monohydrate ⟶

1-(2-Pyridylaz0)-2-Naphthol ⟶

Ethyl Red ⟶

Fast Garnet GBC base ⟶

Acid Alizarin Violet N (Mordant Violety 5) ⟶

Azobenzene-2-Sulfenylbromide ⟶

Azomethane ⟶

Azorubin (Amarnath, Acid Red 27) ⟶

Acid Yellow ⟶

Other dyes which have chemical structures which may generally be characterized by the following may be used as well:

Generally, the preferred procedure involved reacting the polymer, with or without the modifying agents mentioned above, and AZO dye compound in a suitable solvent such as water, dimethyl formamide (DMF), N-methyl pyrolidone (NMP), dimethyl sulfoxide (DMSO), ethyl alcohol (EA), isopropyl alcohol (IA), or a mixture of water and DMF, NMP, DMSO, EA and IA. For some examples, isomerizable AZO dye were mixed where for other examples the dye moieties were covalently bonded to the main polymer chain.

Composite polymer preparation involved a simple method of reacting polyvinyl alcohol with butylisocyanate as described by F. Arranz et al., Die Angwandte Makromolekulare Chemie, 152, 79-91 (1987). Composite polymer formation reactions were carried out on other similar polymers such as poly(ethylene vinyl alcohol) with acrylamide to obtain its corresponding graft copolymer as described by Kang De Yao et al., Macromol. Sci Chem. A24, (10), 1191 (1987). The polymer-dye or composite-polymer solution mixture was heated to about 60° C. for a 10-15 minute duration, after which it was cooled to room temperature. The solution was poured onto a spinning glass plate of 4"×5" dimension. Spinning rate depended on the thickness desired, viscosity of the solution, as well as its temperature. Thicknesses of 10μ-1000μ were used. Generally, spin coating at 50-1000 rpm to achieve thickness of 10μ-1000μ was done under a laminar flow hood to avoid dust and other aerial particle contamination. After spinning was completed, the plate was stored in the laminar flow hood in a horizontal position until dry. The plate was then heat treated to between 70°-90° C. for 10-60 minutes to achieve higher performance efficiency, enhance storage life, and enhance response time.

The following examples are intended to further illustrate, not limit, the present invention. The examples can be classified as follows: (1) those that yielded much improved efficiency than previously reported using methyl orange by a mixing technique, (2) those that gave high efficiencies using poly(ethylene vinyl alcohol) and methyl orange, (3) those that gave high efficiency using polyvinyl alcohol graft copolymer and methyl orange, (4) those that gave high efficiency using poly(vinyl alcohol) and ethyl orange, (5) those that gave high efficiency using poly(vinyl alcohol) and HABA, (6) those that gave high efficiency using poly(ethylene vinyl alcohol) and HABA, (7) those that gave high efficiency using poly(vinyl alcohol) graft copolymer and methyl orange, ethyl orange, HABA, Sudan III, Sudan IV, Fast Garnet BGC Base, Mordant orange, Acid Blue 161, Disperse Orange 25, Disperse Red 1, Mordant Blue g, Ponceau 5, methyl red, Sudan orange G, Chrysoidin, Mordant Orange 1, toluidine red and (8) those that gave high efficiency by attaching the dye moieties covalently to poly(vinyl alcohol) or poly(ethylene vinyl alcohol) as described in Makromol. Chem. Rapid Commun. 10 (5) 5-8 (1989) by K. Ichimura et al. and in Makromol. Chem. 190, 469 (1989) by Nuyken et al. Photo induced birefringence was measured according to the formula $\eta = \sin^2(\pi d \Delta n / \lambda_G)$ where $\lambda = 0.633$ nm. Generally, index modulation of the recorded media, $\Delta n$, in the following examples is 0.004 while in the state of the art is only 0.0009 as discussed above.

EXAMPLE I

Poly (vinyl alcohol) 50 g was added to deionized water at room temperature and then heated at 90° C. for 30 minutes to obtain a homogeneous viscous solution A. Ethyl Orange 2 g was mixed in 20 ml water and stirred well to get homogeneous solution B. Solution A and Solution B were mixed, and the mixture was stirred well and filtered through Whatman filter paper. The filtered viscous solution was poured on a clean glass plate which was then spun at 100 revolutions per minute (RPM) for five minutes. The plate was then dried in a laminar flow hood for six hours. The dry plate was ready to test in a memory storage device. The memory storage device was tested by recording and erasing and rerecording as follows:

Recording was accomplished by optically inducing birefringence, a method derived from the erase mode of a polarization holography read/write/erase system in which material is exposed to a single beam of polarized light. It has been found that polarization-only modulation produces efficient polarization holograms. Two methods of recording were used, single (birefringent) and dual (holographic) beam methods.

In the single beam birefringent method a read beam from a 633 nm He Ne laser was sent through crossed polarizers and the coating was placed between the polarizer and analyzer. There was no transmitted light through the analyzer. A second laser, a 544 nm He Ne, was polarized to the spot where the 633 light was incident. Light from a 488/514 nm argon laser worked and it is possible that polarized incoherent light will also work. The dye-polymer responded to green light when the dye isomerized in the direction orthogonal to the direction of polarization. This isomerization created stress in the polymer matrix and induced birefringence. Since the direction of stress was orthogonal to the 514 polarization it was at 45° to the 633 nm polarization, and the red light was phase retarded, allowing it to pass through the analyzer. Phase retardations as high as 87° have been obtained. The response time was faster at higher recording power and with thin film.

Figures 1, 2:
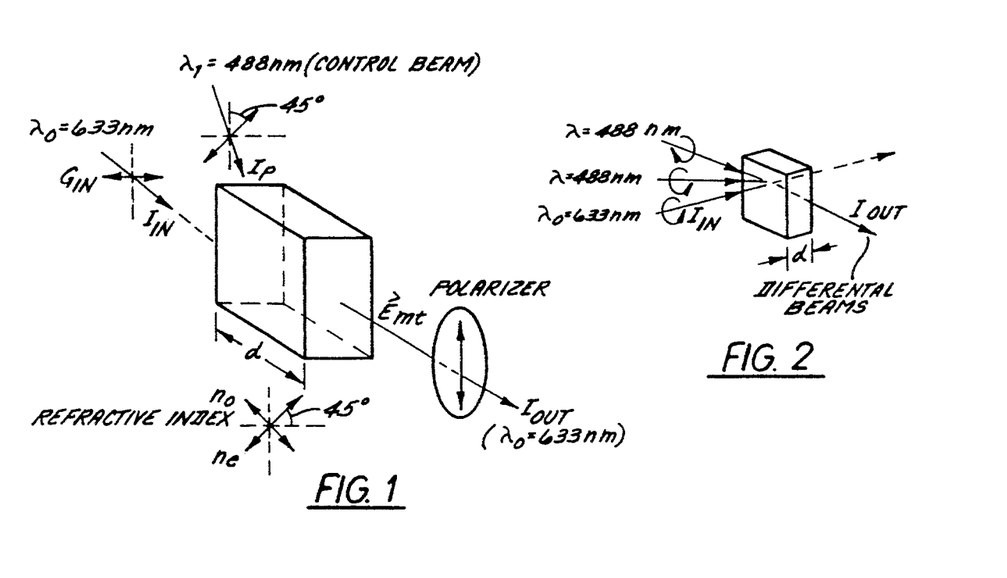

Diffraction efficiency was measured as shown in FIG. 1 and described here. The following equations apply:

$$n_e = n_o + \alpha I_P$$

$$\Delta n = n_e - n_o = \alpha I_P \text{ (photoinduced birefringence)}$$

when $I_P = 0$, the polarization direction of $E_{out}$ is the same as $E_{in}$, which is horizontal. But, because the axis of the polarizer is vertical, $E_{out}$ is totally blocked by the polarizer and $I_{out} = 0$. Transmittance $\eta = I_{out}/I_{in} = 0$.

When $I_P \neq 0$ and $\Delta n > 0$ transmittance is given by $$\eta = I_{out}/I_{in} = \sin^2 \frac{\pi d \Delta n}{\lambda_o}$$

due to the change in polarization state of $E_{in}$ (caused by $\Delta n$, the photoinduced birefringence). If $$\frac{\pi d \Delta n}{\lambda_o} = \frac{\pi}{2}$$

then $\eta = 100\%$. This corresponds to the case where the polarization direction of $E_{in}$ is rotated by 90° from horizontal to vertical, which means that all the light can go through the polarizer whose axis is also vertically oriented.

In the dual beam (holographic) method a write beam from an Argon 488 nm laser was deflected from a mirror, polarized by a quarter waveplate, and then split by a beam splitter. One of the beams was directly incident on a sample plate containing the media while the other split beam was deflected from a mirror and passed through a half waveplate to the same spot on the sample where the first beam was incident. The reading or efficiency measurement was achieved using a He Ne (633 nm) laser reflected by a mirror and polarized by a quarter waveplate incident on the same spot. Efficiency was measured in real-time.

Diffraction efficiency in the dual beam case was measured according to $$\eta = \frac{I_{out}}{I_{in}} = \sin^2 \frac{\pi d \Delta n}{\lambda_o \cos\theta}$$

where $\lambda_o = 0.633$ μm, $\theta = 10°$. So $\Delta n$ was calculated based on measured $\eta$ and d. $\theta$ was the incidence angle of the reading beam $\lambda_o$ as illustrated in FIG. 2.

Overwrite was accomplished by adding a chopper to the above arrangement between the sample and the write beam from the beam splitter. When the chopper turned off one of the writing beams the diffracted beam was not seen. When the beam was on the diffracted beam was seen and information was recorded on the medium.

Preferred processing involved heating the dye polymer coating prior to recording. Heating enabled the recorded information on the coating to remain after the beam was turned off as is the case in polarization holography. The heat processing removed or delayed the dye's capability to return to its previous isomerization state on its own. Without it, the recording was lost.

Figure 3:
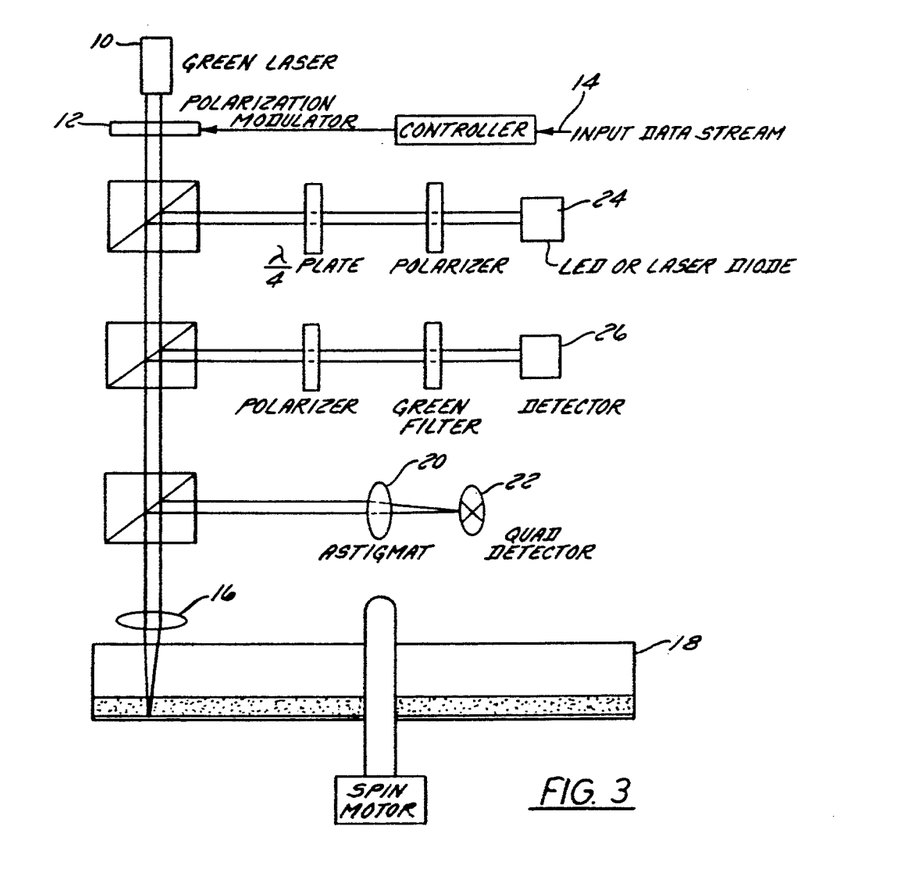

Diffraction efficiency was 82% at a response time of 100 μsec. Response time was defined as the time it took to generate detectable diffraction efficiency of the He Ne 633 nm beam. Response time varied with dye concentration, thickness, processing conditions, and beam power and ranged from 40 μsec to 10 msec. Efficiency was measured at the response time of the sample and increased with time of exposure as shown in FIG. 3.

EXAMPLE II

Poly(ethylene vinyl alcohol) was dissolved in isopropyl alcohol:deionized water (65:35 to 50:50 v/v) and the viscous solution was filtered through Whatman filter paper to remove unwanted particles or undissolved polymer molecules. To this solution was added a solution of 2 g ethyl orange in 20 ml water. The mixture was stirred well to make a homogeneous solution which was filtered again through Whatman filter paper. The clear solution was then spin coated on a clean, dry glass plate. the spin coating was done in a laminar flow hood to avoid dust contamination. The coated plate was then dried at room temperature by placing it horizontally in the laminar flow hood for one day, and then heat treated at 70° C. for 10 minutes before testing it for information storage as described in Example I. Diffraction efficiency was 77 % at a response time of 90 μsec.

In Examples III & IV the procedure remained the same as in Examples I and II but the ingredients and their relative concentrations were changed.

EXAMPLE III

Poly Ethylene vinyl alcohol⟶20 g.

Deionized water⟶80 ml.

Isopropyl alcohol⟶120 ml.

Methyl Orange⟶2 g.

In order to obtain optimum performance it was desirable that the polymer solution, dye solution, and the mixture of dye polymer solution was homogeneous and clear, so that a uniform film could be obtained. Diffraction efficiency was 63 % at 1 msec.

EXAMPLE IV

Polyvinyl alcohol⟶15 g.

Deionized water⟶100 ml.

Glycerine or n-butyl benzene⟶0.1 g.

Ethyl Orange⟶4 g.

In Example IV glycerine or n-butyl benzene was used as a plasticizer. Also the concentration of ethyl orange was increased in order to obtain maximum efficiency and index modulation. In this example, various coating plates were prepared at different dye concentrations ranging from 4.5 % to 25%. As the concentration of the dye in the coating film was increased birefringent refractive index modulation was increased. For example, index modulation $\Delta n$ at 4.5% dye concentration was only $0.45 \times 10^{-3}$ using 488 nm wavelength of $Ar^+$ laser whereas at 20% dye concentration An was increased to $1.2 \times 10^{-2}$ under identical experimental conditions. Also it was observed that the index modulation was slightly higher at 514 nm ($\Delta n = 1.3 \times 10^{-2}$) than at 488 nm ($\Delta n = 1.2 \times 10^{-2}$). Thus, during condensation reaction, the water molecule was released and HABA AZO dye moiety was covalently attached to the polymer. Diffraction efficiency was 65% at a response time of 40μ seconds.

EXAMPLE V

In this example a dye moiety was covalently attached to a polymer backbone. The polymer used was poly(ethylene vinyl alcohol) with 76% degree of hydrolysis. The dye used was HABA dissolved in water with the following chemical structure wherein the —COOH group took part in the condensation reaction with OH of poly(ethylene vinyl alcohol) whose chemical structure is where n ranged from 1200-1400 and m from 200-300.

The experimental preparation involved dissolving 2 g of poly(ethylene vinyl alcohol) in 10-20 ml DMF. To this solution was added a solution of HABA (0.5 g in 5 ml DMF) in DMF. The mixture was stirred and heated to 80° C. To this mixture a drop of thionyl chloride was added before heating the mixture to 90° C. for one hour. The homogeneous solution obtained was poured into methanol, washed several times, and then dried. The composite of poly(ethylene vinyl alcohol) and HABA was then dissolved in chloroform and spin coated on a clean dry glass plate with a thickness of 10 μm. The film was then tested for its write, read, and erase capability as in Example I. The efficiency obtained exceeded 65% at a response time of 1 msec.

EXAMPLE VI

Example VI was similar to Example V, except for the matrix material which was poly(vinyl alcohol) instead of poly(ethylene vinyl alcohol). The thickness of the coating was about 40 μm and the efficiency obtained was over 80% at a response time of 1.2 msec under the conditions described in Example I.

EXAMPLE VII

In this example 20 g poly(vinyl alcohol) was dissolved in 150 ml deionized water, and 1 g HABA was dissolved in 10 ml DMF, and the two solutions were mixed together. The homogeneous viscous solution was then spin-coated on a clean flat glass plate at 100 RPM. The plate was dried as in Example I. The thickness was about 40 μm. Efficiency obtained was 81% at a response time of 1.4 nsec.

EXAMPLE VIII

Poly(vinyl alcohol) 20 g in 100 ml deionized water was mixed well and heated to make a homogeneous solution. To this solution a Fast Garnet Blue solution (0.5 g in 10 ml DMF) was mixed thoroughly. The combined solution was spin coated on a dry glass plate at 100 RPM to obtain a uniform coating of 50 μm. The coating was dried in a laminar flow hood at room temperature overnight. The dry film was then tested as described in Example I for its write, read, erase capability as well as response time. Efficiency was 40% at a response time of 1 msec.

EXAMPLE IX

Example IX was very similar to Example VIII except that the polymer was changed to poly(ethylene vinyl alcohol) in isopropyl alcohol:water (2:1 v/v). The diffraction efficiency was 50% at a response time of 900 μsec.

EXAMPLE X

Example X was similar to Example VIII except that the dye was changed from Fast Garnet Blue to Evans Blue. The thickness of the film was 15 μm and efficiency was 32% at a response time of 1 msec.

EXAMPLE XI

In this example poly(ethylene vinyl alcohol) and erythrosein were used. Poly(ethylene vinyl alcohol) 20 g was dissolved in alcohol:water (2:1 v/v) mixture. Erythrosein dye solution (0.5 g in 2 ml water) was added to this solution. The mixture was stirred carefully and spin coated on a clean and dry glass plate. The thickness was 10 μm. The efficiency obtained was 32% at a response time of 5 msec.

EXAMPLE XII

This example was the same as Example XI with a change in the polymer from poly(ethylene vinyl alcohol) to poly(vinyl alcohol). Thickness was 10 μm. Efficiency was 30% at a response time of 7 msec.

EXAMPLES XIII to XX

In Examples XIII to XX, poly(ethylene vinyl alcohol) grafted with acrylamide prepared according to the method described in J. Macromol. Sci. Chem. A24(10) 1191 (1987) by Kang De Yao et al.) was used as a polymer whereas HABA, Methyl Orange, Ethyl Orange, Erythrosein, Evans Blue, Fast Garnet, Methyl Red, and Sudan IV were used as dyes respectively. All other experimental conditions were the same as in Example 1.

In Example XIII thickness was 20 μm and efficiency was 35% at a response time of 1.5 msec. In Example XIV thickness was 22 μm and efficiency was 35% at a response time of 1.4 msec. In Examples XV to XX thickness ranged from 20 to 35 μm and efficiency ranged from 32 to 75% at response times of 0.5-2 msec.

The physical properties of AZO dye polymer film that have been found to affect efficiency are film thickness, degree of charging of the dye moiety on the polymer backbone or the concentration of dye, and birefringence of the polymer. For best efficiency, thickness of the film used was found to be about 100-150 μm and dye charging (loading or concentration) of about 10%.

The birefringent recording process used above is believed to require that light be absorbed and the temperatures rise in the medium. At elevated temperatures the rate of decay of Cis isomers increases (the Cis→trans transformation is a thermally activated process). The new information is recorded by the state of polarization of the recording beam. Thus, along the direction of incident polarization the trans→Cis transformation is assisted by the recording beam, while in all other directions the only transformation that is allowed is the reverse (Cis→trans) transformation which is now accelerated by the elevated temperature. Any previous state of birefringence that might be recorded in the medium is thus attenuated while the new information is being recorded as a new direction of birefringence.

The material of the present invention is not binary in amplitude. The state of polarization within the mark can have a finite number of possibilities. For instance, one may choose 32 different directions of polarization (really, axes of birefringence) and put many bits of information in a 1 μm size spot.

The material of the present invention affords the possibility of combining polarization modulation (changing axis of birefringence) with width modulation (in the conventional sense of modulation coding of user data). In this way a 2-dimensional modulation code that takes advantage of both amplitude and width modulation of the recording waveform may be employed as is now described.

Induced birefringence is used as a means of storing information on small regions of a disk. With diffraction limited optics, the focused spot size is given by $$D=\lambda/NA$$

where λ is the wavelength of the read/write beam and NA is the numerical aperture of the focusing objective. Assuming that a blue Ar+ laser is used for writing (λ=488 nm), and either red HeNe (λ=633 nm) or infrared GaAlAs (λ=800 nm) lasers are used for readout, numerical apertures as high as NA=0.6 can be used to achieve spot sizes of about 1 μm. This is comparable to what is being done in other optical disk recording techniques. The unexpected difference afforded by the present invention lies in the number of bits that can be recorded per spot. Existing optical storage technology basically detects the presence or absence of a mark at any given location on the disk. The mark thus comprises a single binary digit (0 or 1). With birefringent material many more bits may be stored on a given spot by orienting the axis of induced anisotropy in several possible directions. For example, if we allow the recorded spot to have one of 32 possible axes of anisotropy, this amounts to 5 bits of information per spot.

It should be kept in mind that high NA objectives have a small depth of focus d given by $$d=\lambda/(NA)^2$$

Thus, for λ=488 nm and NA=0.6 the depth of focus is only about 1 μm. Therefore, the film thickness preferably not be greater than this depth of focus. In order to achieve large signal to noise ratios, as is preferable in storage systems, there preferably is a large concentration of dye in the polymer matrix. The power density may preferably be large enough to create significant birefringence ($>10^{-3}$) in a relatively short period of time (1 μsec~0.1 μsec).

The combination of high power density and large concentration of dye, however, may create large amounts of heat in the medium during recording. The material must therefore be engineered to have large thermal conductivity, so that this heat is efficiently transferred to the substrate (or diffused laterally) before it could damage the organic media.

FIG. 3 is a schematic of a preferred system for recording an optical disc of the material of the present invention. Here the linearly polarized light from the Ar+ laser 10 is passed through an electro-optic modulator 12 which rotates the polarization by an amount determined by data stream 14. If it is desired to store, say, 5 bits per spot then the polarization will be rotated to one of 32 possible orientations. This beam is then focused by the high NA objective 16 on the disk 18 and creates a 1 μm spot with an axis of anisotropy along the direction of incident polarization. The reflected beam is directed toward an astigmatic lens 20 and a quad detector 22 for purposes of focus and track error control. The error control signals are fed back to the carriage of the objective (typically a voice coil) for closed loop control for positioning and focusing the spot on the disk. These error control mechanisms are standard in the optical disk industry and will not be further discussed. The point to emphasize is that since these error control schemes are insensitive to the polarization of the incident light, they constitute an existing technology that can be used in the system without any modifications.

Circularly polarized light from LED 24 is preferably used to read the recorded data. If the birefringence is 90° (this is not necessary, although it makes the point easy to understand) then the transmitted light will be linear and its direction will be related to that recorded in the spot. The analyzer in FIG. 3 converts this information into intensity that can be detected by the photodetector 26. Of course, the practicality of this arrangement depends on the achievable signal to noise ratio which in turn depends on the optical quality of the media, amount of induced birefringence, available laser energy for reading, etc. The readout data rate can also be increased by using several beams of light, reading several tracks in parallel.

The erasing of stored data based on the material of the invention described herein can be achieved by directing a beam with its polarization direction corresponding to the bit "0" onto the disk. Dye molecules will be reordered and the stored information will be erased. Since the erasing mechanism is basically the same as that for writing, the erasing speed is equal to the writing speed.

With respect to data rates, on a 12" diameter disk rotating at 3600 rpm the inner and outer tracks travel at speeds of 12 m/sec and 60 m/sec, respectively. The dwell time for the beam on a 1–2 μm spot is therefore in the range of 20 nsec to 100 nsec. The data rate in the example having 32 different axes of polarization will therefore be between 50 Mbits/sec, and 250 Mbits/sec.

In the video frame recording process the stored video frame is illuminated with monochromatic linearly polarized light. A Faraday rotator or a beam deflector is used to control the direction of the linearly polarized light impinging on the object. When multiple holograms (frames) are to be stored in the same physical spot on the disk, each one must have a different orientation of holographic Bragg planes as a result of the different orientation of the molecules. This is determined by the current input into the Faraday rotator or the angle between the incident beam and the reference beam. The polarization state of the beam is also a factor.

There are two ways this can be achieved. One is to use the storage area for recording a polarization hologram by adjusting the polarization of the reference beam orthogonal to the polarization of the object beam, and installing quarter and half wavelength optical elements in the path of the reference beam. Another way is by using the storage area for recording multiple holograms of the regular type, but where each hologram will have a different direction of polarization. This is possible because of the large dynamic range of the medium of the present invention which enables the system to remain within the linear response curve of the material at each spot during every recording. The time required to record each image can be several milliseconds, depending on the available laser power and response time of the material.

Induced birefringence is the means of storing a frame of information (image) on a small area of a disk. A single frame may preferably be directly stored on an area of the disk measuring $500 \times 500$ $\mu m^2$ as displayed in a preformatted disk structure. Unlike digital disks the effective area of the disk can be larger than the useful area of a digital disk (single beam recording). With a $5\frac{1}{4}$" diameter, single sided platter, the total area is $1.4 \times 10^{10}$ $\mu m^2$. One can divide this area into more than 50,000 squares measuring 500 μm on each side. In each square location, 70 frames may be recorded or read by scanning the reference beam and the polarization state of the beam. Thus, over 3,500,000 frames may be stored in one $5\frac{1}{2}$ diameter system. In digital form that corresponds to 109.5 Gbits of digital information on a single video disk. The potential storage capacity of the system is 2 orders of magnitude higher than any present magneto-optic disk, including video disks.

It is possible to increase the data rate in both optical and video disk applications by using several beams of light, addressing several tracks in parallel. This can be achieved by using a standard diffraction grating to create multiple beams from a laser (assuming it has sufficient power) and using a micro-miniature array of E/O modulators (one for each beam). The objective may preferably have sufficient field of view to accommodate 10 to 20 beams for addressing 10 to 20 tracks simultaneously. Therefore the focusing mechanism need not be replicated.

Current data storage media are physically 2-dimensional in the sense that there is only one layer on each surface of the disk that can store the data. The material of the present invention may be formulated so that its absorption characteristics are tuned to the wavelength of light. By changing the wavelength of the write laser, different layers of material may be addressed and recorded separately and independently. Similarly, by tuning the wavelength of the read laser data may be extracted from individual layers.

An advantage over conventional magneto-optical recording is that the data need not be erased before the track can be written again. In other words, the media has "overwrite" capability. In this respect time is saved during recording on previously written tracks (the extra disk revolution that is needed for erasure in conventional erasable recording is no longer required). The material of the present invention is similar to ordinary magnetic disks (floppies as well as Winchester-type hard disks) in terms of overwrite capability. Therefore, existing operating systems have the ability to accommodate the material described.

The material of the present invention has many features that are not found in currently available optical storage media as well. The media is all optical, i.e., not volatile. In other words loss of power will not result in loss of data. Furthermore optical systems, unlike electronic systems are immune to electromagnetic pulses.

Embodiments of the present invention not disclosed herein are fully intended to be within the scope of the claims.

We claim:

1. An optical storage medium comprising a transparent polymer and an isomerizable AZO dye, said optical storage medium being coated as a solution including a solvent selected from the group consisting of water, dimethyl formamide, N-methyl pyrolidone, dimethyl sulfoxide, ethyl alcohol and isopropyl alcohol, on a substrate so as to form a film having a thickness of at least 10 μm, storing information through birefringence and having a diffraction efficiency greater than 40% at a 1 millisecond response time, wherein said isomerizable AZO dye remains in the film and is present in a concentration of from 4.5% to 25% based on the weight of the film.

2. The optical storage medium as defined in claim 1 wherein the transparent polymer and isomerizable AZO dye are blended before the optical storage medium is coated on the substrate.

3. The optical storage medium as defined in claim 2 wherein the transparent polymer is mixed with at least one member selected from the group consisting of paraformaldehyde, glyoxal, buteraldehyde and acrylic acid, and the diffraction efficiency is from 85% to 90%.

4. The optical storage medium as defined in claim 1 wherein the isomerizable AZO dye is covalently bonded to the transparent polymer before the optical storage medium is coated on the substrate.

5. The optical storage medium as defined in claim 4 wherein the AZO isomerizable AZO dye is covalently bonded to the transparent polymer through a crosslinker.

6. The optical storage medium as defined in claim 1 wherein the transparent polymer is mixed with at least one member selected from the group consisting of glyoxal, formaldehyde and acrylic acid.

7. The optical storage medium as defined in claim 1 wherein the transparent polymer corresponds to the formula wherein n is an integer of from 1200 to 1400 and m is an integer of from 200 to 300, said transparent polymer being hydrolyzed to within the range of from 72 to 88%, said transparent polymer being capable of forming a homogeneous solution with a mixture comprising an alcohol and water.

8. The optical storage medium as defined in claim 1 wherein the transparent polymer corresponds to the formula wherein m is an integer of from 200 to 300, n is an integer of from 1200 to 1400 and t is an integer of from 7 to 40.

9. The optical storage medium as defined in claim 1 wherein the transparent polymer is at least one member selected from the group consisting of poly (vinyl acetate), poly (vinyl alcohol), poly (styrene), poly (methyl methacrylate), epoxy resin, poly (vinyl chloride), poly carbonate, poly (styrene-co-acrylonitrile), poly (allyl diglycol carbonate), poly (methyl pentane), poly (acrylonitrile-butadiene styrene) terpolymer, poly (styrene-co-methyl-methacrylate), poly (ethylene vinyl alcohol), poly (vinyl acetal), poly (propylene), poly (ethylene-co-acrylic acid), poly (ethylene-co-ethyl acrylate), and phenol-formaldehyde resin.

10. The optical storage medium as defined in claim 1 wherein the isomerizable AZO dye is at least one member selected from the group consisting of Ponceau 5, Mordant Blue 9, Methyl Red, Methyl Orange, Methylene Blue, Disperse Orange 25, Disperse Red 1, Palatine Chrome Black 6BN, Palatine Chrome Black WAN, Palatine Fast Yellow BLN, Acid Blue 161, Acid Red 183, Ethyl Orange, Crocein Orange, Diphenylthiocarbazone, Mordant Orange 10, Mordant Yellow 7, Chrysoidin, Mordant Orange 1, Mordant Yellow 10, Mordant Yellow 12, Toluidine Red, Sudan Orange G, 4-(2-Pyridylazo) Resorcinol Monosodium Salt Monohydrate, 1-(2-Pyridylazo)-2-Naphthol, Ethyl Red, Fast Garnet GBC base, Acid Alizarin Violet N, Azobenzene-2-Sulfenylbromide, Azomethane, Azorubin (Amaranth, Acid Red 27), Acid Yellow, Oil Red 0, Sudan III, Sudan IV, Mordant orange 10, and HABA and said transparent polymer is compatible with said isomerizable AZO dye when said isomerizable AZO dye is present in a concentration of from 0.4% to 25% based on the weight of the film.

11. The optical storage medium as defined in claim 1 wherein the transparent polymer corresponds to the formula where R is —CH$_3$ or —H
R' is —COCH$_3$, —OH, —Cl, CH$_3$—CH=CH— or CH$_3$—CH$_2$— and n is an integer from 1200 to 1400.

12. A method of making an optical storage medium having a diffraction efficiency greater than 40% at less than a 1 millisecond response time including a transparent polymer and an isomerizable AZO dye comprising preparing a solution of the transparent polymer and a solution of the isomerizable AZO dye, mixing the solution of the transparent polymer and the solution of the isomerizable AZO dye to form a mixed solution, including a solvent selected from the group consisting of water, dimethyl formamide, N-methyl pyrolidone, dimethyl sulfoxide, ethyl alcohol and isopropyl alcohol, coating the mixed solution on a substrate so as to obtain a coated substrate having a film from the mixed solution having a desired thickness of at least 10 μm and heating the coated substrate to a temperature of from 50° C. to 90° C., wherein the isomerizable AZO dye remains in the film in a concentration of from 4.5% to 25% based on the weight of the film.

13. The method of claim 12 further comprising spinning the substrate at 50–1000 rpm to obtain the desired thickness, said desired thickness being from 10 μm to 1000 μm.

14. A method of recording comprising:
providing an optical storage medium having a diffraction efficiency greater than 40% at less than a 1 millisecond response time including a transparent polymer and an isomerizable AZO dye by
preparing a solution of the transparent polymer and a solution of the isomerizable AZO dye,.
mixing the solution of the transparent polymer and the solution of the isomerizable AZO dye to form a mixed solution, including a solvent selected from the group consisting of water, dimethyl formamide, N-methyl pyrolidone, dimethyl sulfoxide, ethyl alcohol and isopropyl alcohol, coating the mixed solution on a substrate so as to obtain a coated substrate having a film of the mixed solution having a thickness of at least 10 μm, and heating the coated substrate to a temperature of from 50° C. to 90° C.;

exposing the optical storage medium to a variably polarizable laser beam; and focusing said beam to a spot on the optical storage medium, wherein the isomerizable AZO dye remains in the film.

15. An optical storage medium comprising poly (vinyl alcohol) and a isomerizable AZO dye selected from HABA, Ethyl Orange, Methyl Orange, Fast garnet Blue, and Evans Blue, said optical storage medium having a diffraction efficiency of from 40% to 90%, wherein the optical storage medium is coated on a substrate so as to form a film having a thickness of at least 10 μm, said isomerizable AZO dye remains in the film in a concentration of from 4.5% to 25% based on the weight of the film, the isomerizable AZO dye is uniformly distributed into a solution including a solvent selected from the group consisting of water, dimethyl formamide, N-methyl pyrolidone, dimethyl sulfoxide, ethyl alcohol and isopropyl alcohol, before coating the substrate, the isomerizable AZO dye is uniformly distributed in the film, and said optical storage medium has a diffraction efficiency of from 40% to 90% at a 1 millisecond response time.

16. The optical storage medium as defined in claim 15 wherein the transparent polymer is poly(vinyl alcohol) hydrolyzed to 70–88% and has an average molecular weight of from 75,000 to 90,000.

17. The optical storage medium as defined in claim 15 wherein the transparent polymer is poly(ethylene vinyl alcohol).

18. An optical storage disk having erase and direct overwrite capability comprising a substrate and an optical storage medium film coated on said substrate as a solution, including a solvent selected from the group consisting of water, dimethyl formamide, N-methyl pyrolidone, dimethyl sulfoxide, ethyl alcohol and isopropyl alcohol, said optical storage medium film having a thickness of at least 10 μm and a diffraction efficiency greater than 40% at less than a 1 millisecond response time comprising a transparent vinyl polymer and an isomerizable AZO dye wherein the isomerizable AZO dye remains in the optical storage medium film in a concentration of from 4.5% to 25% based on the weight of the film and bits of stored information are orientated along an axis of induced anisotropy.

19. The disk as defined in claim 18 wherein distinct frames of information are stored in a volume of optical storage medium film with different orientations.

* * * * *

UNITED STATES PATENT AND TRADEMARK OFFICE
CERTIFICATE OF CORRECTION

PATENT NO. : 5,384,221  
DATED : January 24, 1995  
INVENTOR(S) : Savant et al.

Page 1 of 3

It is certified that error appears in the above-indentified patent and that said Letters Patent is hereby corrected as shown below:

Title page item [57], ABSTRACT, line 5, after "from" insert -- 10 --;

Column 7, Line 46,
$$H-(CH_2-CH_2)_m-(CH_2-\underset{OH}{CH})_n-(CH_2-\underset{COCH_3}{CH-})_t-H$$

should read $$H-(CH_2-CH_2)_m-(CH_2-\underset{OH}{CH})_n-(CH_2-\underset{COCH_3}{CH})_t-H$$

Column 7, Line 51,
$$H-(CH_2-\underset{R^1}{\overset{R}{CH_2}}-)_n-(CH_2-\underset{R}{CH})H$$

should read

$$H-(CH_2-\underset{R'}{\overset{R}{CH_2}})_n-(CH_2-\underset{R}{CH})-H$$

UNITED STATES PATENT AND TRADEMARK OFFICE
CERTIFICATE OF CORRECTION

PATENT NO. : 5,384,221
DATED : January 24, 1995
INVENTOR(S) : Savant et al.

It is certified that error appears in the above-indentified patent and that said Letters Patent is hereby corrected as shown below:

Column 8, Line 36, should read

Column 8, line 41, should read

Column 19, line 25, delete "An" and insert --Δn--.
Column 20, line 9, delete "when" and insert --When--.
Column 20, line 53, after "off" insert --,--.
Column 20, line 54, after "on" insert --,--.
Column 21, line 15, delete "the" and insert --The--.
Column 21, line 58, after "increased" insert --,--.

UNITED STATES PATENT AND TRADEMARK OFFICE
CERTIFICATE OF CORRECTION

PATENT NO. : 5,384,221
DATED : January 24, 1995
INVENTOR(S) : Savant et al.

It is certified that error appears in the above-indentified patent and that said Letters Patent is hereby corrected as shown below:

Column 21, line 62, after "concentration" delete "An" and insert --$\Delta n$--.

Column 22, line 23, should read

Column 26, line 61, after "Furthermore" insert --,--.
Column 28, line 65, after "dye," delete --.--.

Signed and Sealed this

Seventeenth Day of September, 1996

BRUCE LEHMAN

*Attest:*

*Attesting Officer*  *Commissioner of Patents and Trademarks*